United States Patent
Gomez et al.

(10) Patent No.: US 8,035,445 B2
(45) Date of Patent: Oct. 11, 2011

(54) FREQUENCY RESPONSE COMPENSATION AMPLIFIER ARRANGEMENTS

(75) Inventors: Ramon A. Gomez, San Juan Capistrano, CA (US); Navin Harwalkar, Austin, TX (US); Bryan Juo-Jung Hung, Irvine, CA (US); Francesco Gatta, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/847,888

(22) Filed: Jul. 30, 2010

(65) Prior Publication Data

US 2011/0193626 A1 Aug. 11, 2011

Related U.S. Application Data

(63) Continuation-in-part of application No. 12/770,233, filed on Apr. 29, 2010.

(60) Provisional application No. 61/302,798, filed on Feb. 9, 2010, provisional application No. 61/302,809, filed on Feb. 9, 2010, provisional application No. 61/308,545, filed on Feb. 26, 2010.

(51) Int. Cl.
*H03F 3/68* (2006.01)

(52) U.S. Cl. .................... 330/124 R; 330/295
(58) Field of Classification Search ............. 330/124 R, 330/295, 84, 126
See application file for complete search history.

(56) References Cited

U.S. PATENT DOCUMENTS

| 5,793,253 | A  | * | 8/1998 | Kumar et al. | 330/124 R |
| 7,336,125 | B2 | * | 2/2008 | Kyu et al. | 330/51 |
| 7,352,239 | B2 | * | 4/2008 | Lee et al. | 330/124 R |
| 7,508,268 | B2 | * | 3/2009 | Sasaki et al. | 330/295 |

* cited by examiner

*Primary Examiner* — Henry Choe
(74) *Attorney, Agent, or Firm* — Sterne, Kessler, Goldstein & Fox P.L.L.C.

(57) ABSTRACT

An embodiment of the present invention provides a system comprising a summing device and first amplifier portion. The summing device is coupled to an output node. The first amplifier portion is coupled between an input node and the summing device. The first amplifier portion includes a first amplifier, a first filter, and first and second switches. The first amplifier is coupled between the input node and the summing device on a first path. The first filter is coupled between the input node and the first amplifier on a second path, the second path being in parallel to the first path. The first switch is coupled between the input node and the first amplifier along the first path. The second switch is coupled between the input node and the first filter along the second path.

10 Claims, 5 Drawing Sheets

FREQUENCY RESPONSE COMPENSATION AMPLIFIER ARRANGEMENTS

CROSS REFERENCE TO RELATED APPLICATIONS

This application claims priority under 35 U.S.C. §119(e) to U.S. Provisional Patent Applications 61/302,798, filed Feb. 9, 2010, 61/302,809, filed Feb. 9, 2010 and 61/308,545, filed Feb. 26, 2010, which are all incorporated by reference herein in their entireties. This application is a continuation-in-part of U.S. application Ser. No. 12/770,233, filed Apr. 29, 2010, and a continuation-in-part of U.S. Application No., filed, (2875.3640001), which are both incorporated by reference herein in their entireties.

FIELD OF THE INVENTION

The present invention generally relates to amplifier arrangements allowing for frequency tilt compensation.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Radio Frequency (RF) amplifiers, including broadband RF amplifiers, are typically designed to have flat gain, noise figure (NF), and linearity over their operating frequency range, as much as practically possible. However, in many applications (e.g., cable television (CATV)), the input signal may not have equal power and density across the entire operating frequency range. Also, broadband multi-channel systems, e.g., cable television (CATV) or terrestrial television, are often transmitted over media (e.g., air, cables, or fibers) with non-flat frequency response. As a result, signal power of individual channels may vary widely across an allocated band at the receiving end, even if the transmitted levels are the same. The power difference over frequency can greatly increase the dynamic range requirement for broadband receivers. As an example, CATV systems can suffer from roll-off at high frequencies. This effect is known as tilt or frequency tilt. With the extension of CATV upper frequency range from 860 MHz to 1 GHz by many operators (to deliver more data services), the amount of tilt seen by CATV users may increase significantly.

When the input signal is amplified by a flat gain amplifier, weaker power components of the resulting amplified signal will have poorer signal-to-noise ratio (SNR) and signal-to-distortion ratio (SDR) than prior to amplification. Further, this degradation in SNR and SDR will continue in subsequent signal processing stages of the overall system.

In some cases, the tilt results in attenuation of the signal so that the power at the receiver is below a threshold amount. In this situation, the tilt is usually compensated for by increasing the power at the transmission and/or receiving end across all channels. However, not all channels may need the increased power. For example, lower frequency signals may need no power increase, such that increasing their power causes too high a power at the receiver.

Therefore, what is needed is a system and method allowing for frequency dependent tilt compensation.

An embodiment of the present invention provides a system comprising a summing device and a first amplifier portion. The summing device is coupled to an output node. The first amplifier portion is coupled between an input node and the summing device. The first amplifier portion includes a first amplifier, a first filter, and first and second switches. The first amplifier is coupled between the input node and the summing device on a first path. The first filter is coupled between the input node and the first amplifier on a second path, the second path being in parallel to the first path. The first switch is coupled between the input node and the first amplifier along the first path. The second switch is coupled between the input node and the first filter along the second path.

Further features and advantages of the embodiments, as well as the structure and operation of various embodiments, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

Figure 1:
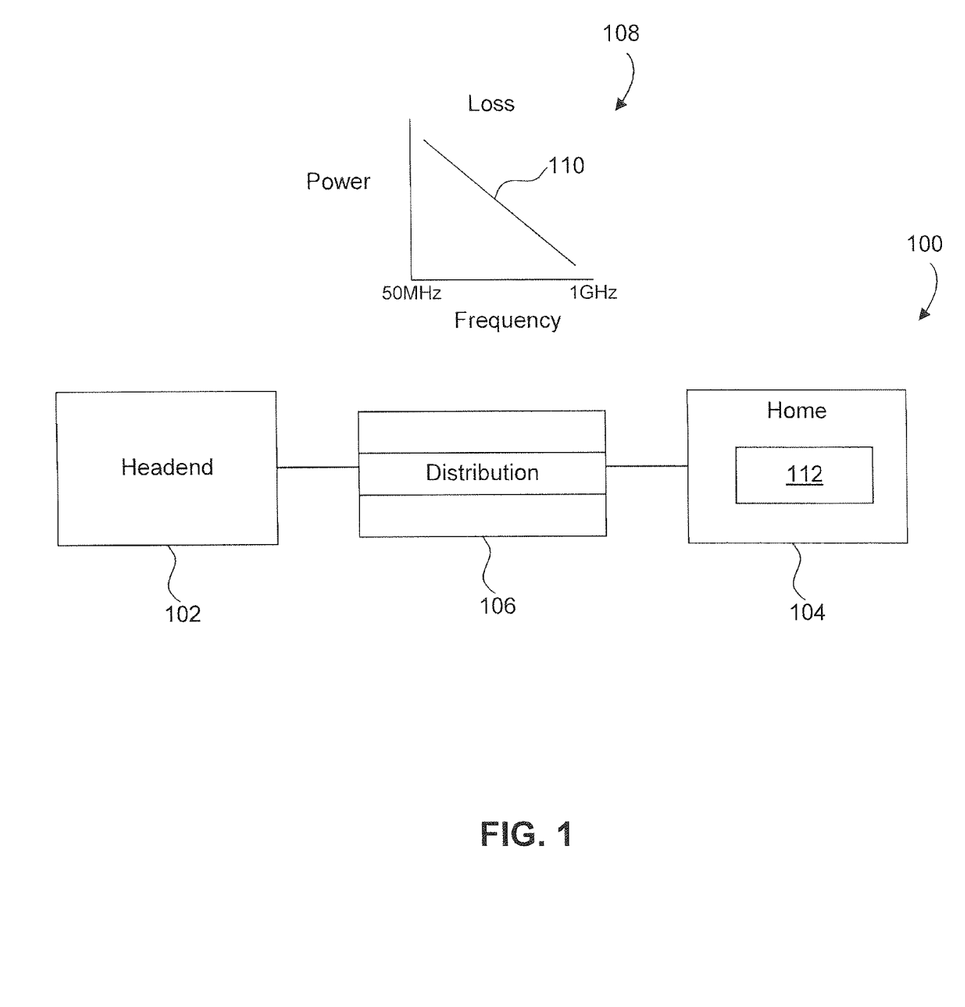
FIG. 1 shows a system, according to an embodiment of the present invention.

FIG. 1 shows a system 100. For example, system 100 can be a television signal system transmitting cable TV (CATV) signals and/or terrestrial TV signals. System 100 includes a first end 102, e.g., a transmission end, a second end 104, e.g., a receiving end, and a transmission medium 106 coupled therebetween.

In one example, first end 102 can be a headend or a television signal distribution location and second end 104 can be a home or user location. Transmission medium 106 can be a distribution device including, for example, a wired device (e.g., coaxial or fiber optic cables) or a wireless device (e.g., antenna, satellite or cellular). A plurality of signals having different frequencies can be transmitted over distribution device 106 substantially simultaneously as either analog, digital, or both analog and digital signals. The signals may represent a plurality of channels corresponding to the plurality of frequencies. For example, 50 MHz to 1 GHz signals can be transmitted over distribution device 106.

In one example, graph 108 represents an exemplary Power versus Frequency signal loss curve 110. The power loss can be based on attenuation of the signal as it travels over distribution device 106. As can be seen in this example, high frequency signals can exhibit larger power loss during transmission than lower frequency signals. As discussed above, there is a minimum threshold power that should be received at home or user location 104 for the signal to be effective. For example, a home system can have front-end noise. A high frequency signal with a below threshold power may not be effective after interacting with the front-end noise due to distortion. In one example, a tilt or slope of curve 110 can be measured to determine if the received power over the frequency band will result in meeting the threshold.

In one example, an amplifying system 112, e.g., a LNA distribution chip, can be located at second end 104. Amplifying system 112 can change the tilt of the signal before forwarding the signal to downstream devices. Changing the tilt of the signal is discussed in more detail below. Herein, signal "tilt" means the gain or loss of the signal over frequency, e.g., a slope of the signal.

Figure 2:
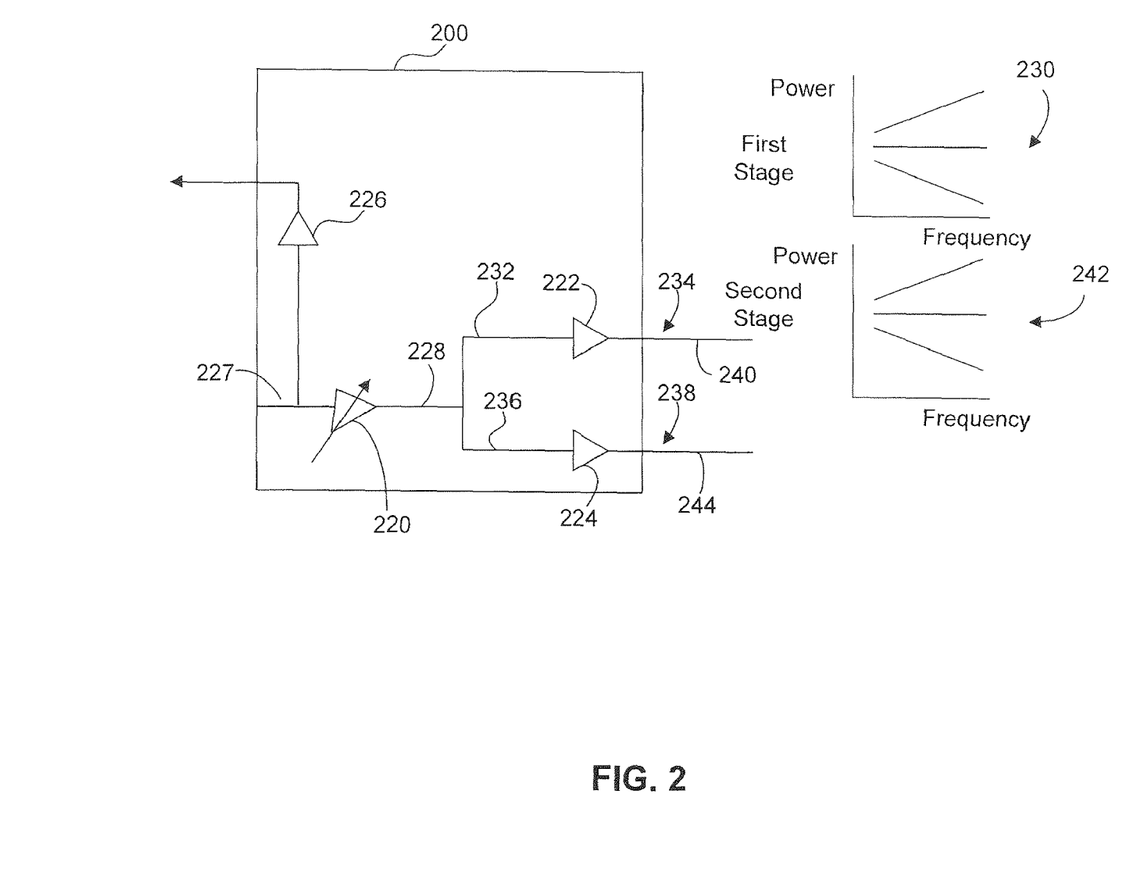
FIG. 2 shows a single input, multiple output amplifier system, according to an embodiment of the present invention.

FIG. 2 shows a single input, multiple output amplifier system 200, according to an embodiment of the present invention. For example, system 200 can be implemented as amplifying system 112 in receiving end 104 of system 100 in FIG. 1. In one example, system 200 includes a first amplifier 220, a second amplifier 222, a third amplifier 224, and a fourth amplifier 226. In one example, first amplifier 220 can be considered a first stage amplifier, second and third amplifiers 222 and 224 can be considered second stage amplifiers, and fourth amplifier 226 can be considered a loop through (LT) amplifier. In this configuration, the first and second stage can be considered cascaded. It is to be appreciated more or fewer amplifiers may be found in each amplifier stage or in the LT portion of system 200, based on a desired application.

In one example, first amplifier 220 can be a configurable, adjustable or programmable amplifier. For example, first amplifier 220 can be a gain-tilt amplifier (also known as a tilt amplifier or a frequency tilt amplifier, used interchangeably herein) having a programmable tilt compensation. In one example, a gain-tilt amplifier inverts the frequency response seen by a high frequency signal. In this example, an input signal 227 can be tilted to generate a signal 228 exhibiting a power to frequency curve as shown in graph 230. For example, signal 228 may have a 0 dB (e.g., flat frequency response), +/−5 dB (e.g., tilted frequency response, where + can be tilt up an − can be tilt down), or +/−10 dB (e.g., tilted frequency response), etc. frequency tilt. Thus, amplifier 220 can either increase, decrease, or maintain a tilt of signal 227 when producing signal 228. In one example, positive tilt compensation can mean that the high frequency portion of the signal will be increased relative to the low frequency portion of the signal. Similarly, negative tilt compensation can beam that thee low frequency portion of the signal will be decreased relative to the high frequency portion of the signal.

In the example shown, signal 228 can be split to produce two substantially equivalent signals 232 and 236. In one example, splitting of signal 228 can be performed through use of a splitting circuit (not shown), while in another example splitting of signal 228 can be done using a wire with a splitting configuration. Signal 232 can travel along path 234 and signal 236 can travel along path 238. In this example, signal 232 can be received by amplifier 222 and signal 236 can be receive by amplifier 224.

Similarly to the function of amplifier 220, second and third amplifiers 222 and 224 can also be implemented as configurable, adjustable, or programmable gain-tilt amplifiers that exhibit a flat or tilted response. For example, a 0 dB, +/−5 dB, or +/−10 dB, etc., tilt can be generated with amplifier 222 and/or amplifier 224. In this example, second amplifier 222 can amplify signal 232 to produce a signal 240 that travels along path 234, and exhibits characteristics of power-frequency curve 230. A tilt or amplitude of signal 232 can be increased, decreased, or maintained by amplifier 222 to produce signal 240. Also, similarly, in this example third amplifier 224 can amplify signal 236 to produce a signal 244 that travels along path 238, and exhibits characteristic of curve 242. For example, a tilt or amplitude of signal 236 can be increased, decreased, or maintained by amplifier 224 to produce signal 244.

In one example, first amplifier 220, second amplifier 222, and third amplifier 224 can function as full spectrum in, full spectrum out amplifiers, such that the only processing of the signal is to correct for any frequency tilt.

Figure 5:
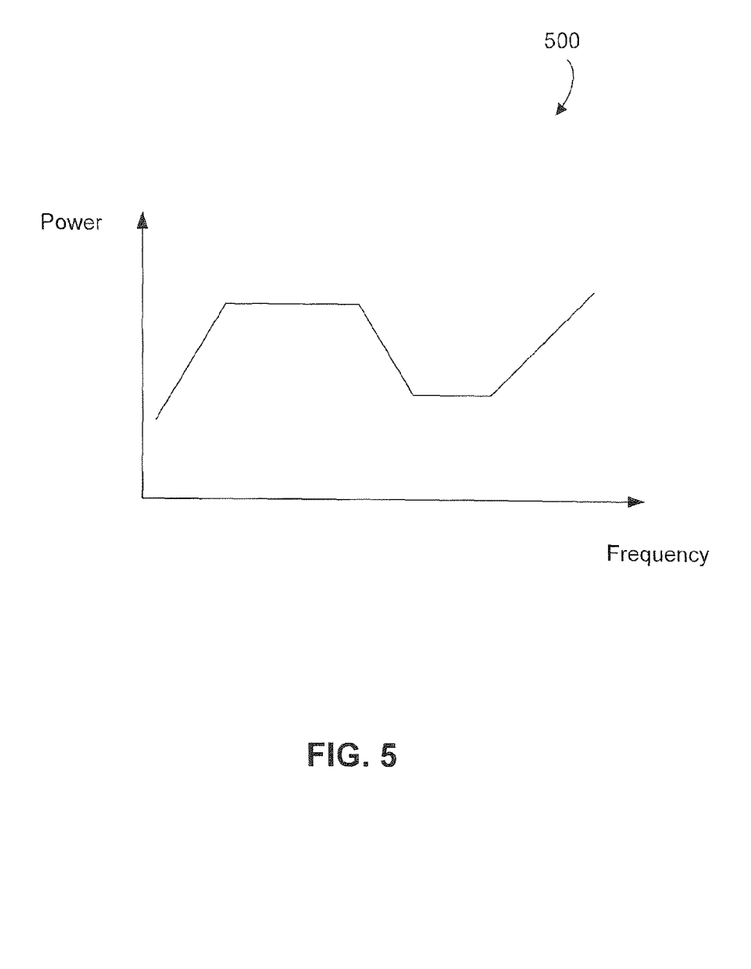
FIG. 5 shows a signal having varying frequency tilts across a spectrum.

In one example, fourth amplifier 226 can be a loop through (LT) amplifier in a loop through (LT) path. In one example, fourth amplifier 226 is a fixed gain amplifier. In one example, LT amplifier 226 can be used to drive set-top boxes that do not have automatic gain control or TV sets. In another example, LT amplifier 226 can have fixed gain, low noise figure and high linearity to substantially eliminate degradation of the TV sets or set-top box that it is driving. Low and fixed gain substantially eliminates TV overload. In another example, LT amplifier 226 can have many modes, low noise figure or high linearity, and its dynamic range can be optimized for the different terrestrial or cable conditions. An exemplary implementation utilizing the LT path is shown in FIG. 5, discussed below.

In one example, amplifiers 220, 222, 224, and 226 can be amplifiers that exhibit a low noise figure with high linearity, e.g., low noise amplifiers (LNAs).

In one example, amplifiers 220, 222, and 224 can have automatic gain control (AGC) paths. Having automatic gain control paths can assure that subsequent downstream devices along paths 228, 234 and 238 will receive a signal having constant input power.

In one example, amplifier 220 is configurable to have either low noise figure and low linearity or normal noise figure and linearity. For example, terrestrial systems emphasize noise figure, while CATV systems emphasize linearity.

In one example, the second stage gain is controlled using a device (not shown) determining an optimal gain based on system wide information gathered regarding signals being processed throughout system 100 and/or system 200 or downstream devices.

In one example, through use of first and second cascaded amplifier stages, implementation of a gain profile exhibiting a stable and desired amount of tilt can more easily be produced. When only one amplifier stage is used, aggressive tilt gain may be required in order to obtain a final desired tilt compensation profile. However, when too much tilt gain compensation is performed, e.g., a large gain at high frequency, undesirable oscillations can occur on an output signal. Also, using a single stage can make it more difficult to obtain a desired power gain without experiencing instability. Thus, using a two cascaded stage amplifier system can allow for more optimal or desired power gain characteristics on the signal.

In one example, the first amplifier stage can perform an initial, and possibly larger, frequency tilt. In one example, the first amplification may be directed to voltage gain. In this example, the second amplifier stage can be used to perform a second, targeted, and possibly smaller frequency tilt. In one example, the second amplification can be directed to current gain. For example, using this cascaded amplification scheme, a coarse adjustment of frequency tilt modification can be followed by a fine adjustment.

In another example, through using first and second stages, a greater variety of tilt profiles can be implemented as compared to using a single amplifier stage.

In one example, each amplification stage, and each amplification, can utilize automatic gain control to implement a minimum noise figure for low amplitude input signals that require large amplification.

In one example, the first amplifier stage can result in a frequency tilt of 5 db and the second amplifier stage can result in an additional frequency tilt of 5 db. If this amount of gain tilt compensation was to be attempted with a single stage, a downstream tuner may not be able to operate properly because optimal tuner performance could be degraded. The degradation can occur because when using a single stage amplifier, the large amount of high-frequency gain due to the tilt profile will tend to cause overload. If this single-stage amplifier has automatic gain control, overload may be avoided, but the gain control circuit will operate to reduce the amplifier gain and typically, this will degrade the single-stage amplifier noise figure. In a two-stage design, the tilt compensation is distributed. Each stage produces part of the total gain tilt compensation. Hence, the two undesirable conditions of overload and increased noise figure due to AGC gain reduction can avoided.

Figure 3:
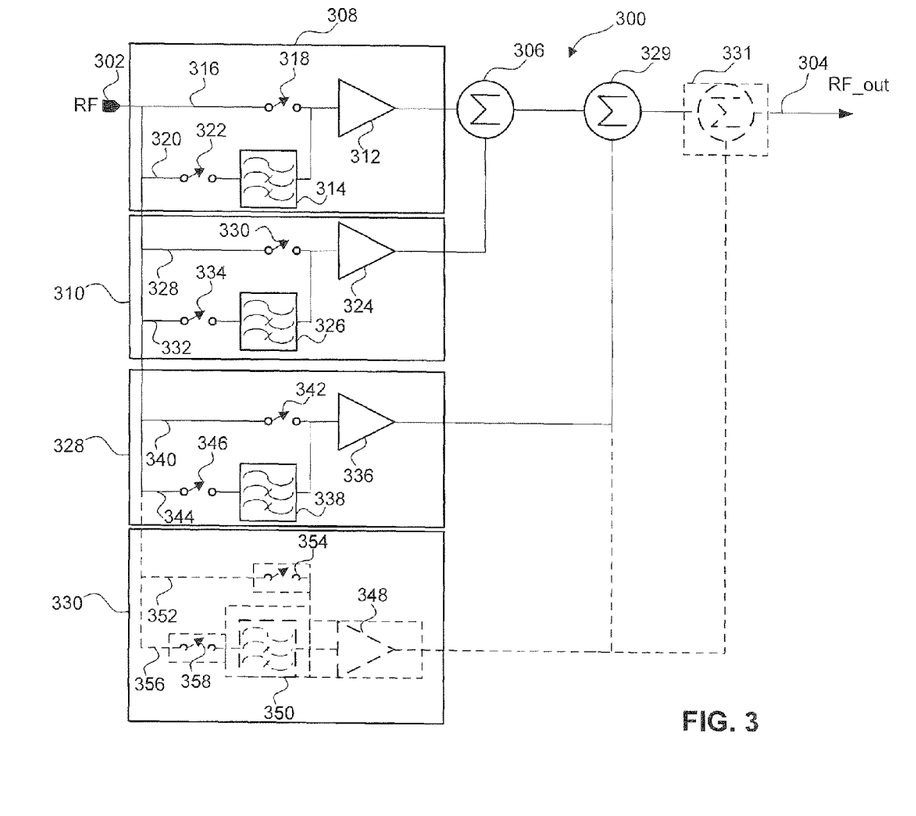
FIGS. 3 and 4 show frequency tilt compensation amplifier systems, according to various embodiments of the present invention.

FIG. 3 shows a configuration for an amplifier system 300, according to an embodiment of the present invention. For example, amplifier system 300 can be used to implement any of amplifiers 220, 222, or 224 in FIG. 2. Amplifier system 300 includes an input node 302, an output node 304, a summing device 306, a first amplifier portion 308, and a second amplifier portion 310.

First amplifier portion 308 includes a first amplifier 312 and a first filter 314. First amplifier 312 is on a first path 316 that also includes a first switch 318. First filter 314 is on a second path 320 that also includes a second switch 322.

Second amplifier portion 310 includes a second amplifier 324 and a second filter 326. Second amplifier 324 is on a third path 328 that also includes a third switch 330. Second filter 326 is on a fourth path 332 that also includes a fourth switch 334.

In one example, switches 318, 322, 330, and 334 can be controlled to allow for a programmed adjustment or frequency tilt compensation for a detected unwanted frequency tilt. For example, each amplifier 312 and 324 can provide 3 dB in tilt compensation, so with this configuration first and second amplifier portions 308 and 310 can be summed using summer 306 to provide between 0 and 6 dB of tilt compensation. Thus, a number of amplifiers 312 and 324 that are operating and summed using summer 306, or additional summers, at a point in time defines a level of tilt compensation provided to an input signal.

If no tilt is detected, all switches can be opened.

If 3 dB of tilt is detected, switch 318 can be closed and switches 330 and 334 can be opened. Depending on whether positive or negative tilt is needed, either a high pass filter or a low pass filter can be implemented for filter 314.

For example, if a high frequency signal is exhibiting negative tilt, a high pass filter can be used for filter 314 having a corner frequency at a desired frequency to only compensate for the high frequency signal power loss, e.g., a corner frequency of about 500 MHz. With switch 322 closed, and using high pass filter 314, the high frequency portion of the input signal will be compensated to allow for about 3 dB of positive tilt, which substantially eliminates the overall tilt on the input signal seen at output 304.

In another example, if a low frequency signal is exhibiting positive tilt, a low pass filter can be used for filter 314 having a corner frequency at a desired frequency to only compensate for low frequency signals. With switch 322 closed, and using low pass filter 314, the low frequency portion of the input signal will be compensated through producing a counter 3 dB negative tilt, which substantially eliminates the overall tilt on the input signal seen at output 304.

It can be appreciate that additional amplifier portions or stages may be used if additional frequency tilt compensation is desired, e.g., 6 dB, 9 dB, etc. For example, as shown in FIG. 3, a third amplifier portion (or stage) 328 and second summer 329 can be added to amplifier system 300 to allow for 6 dB positive or negative tilt compensation through summing of the amplifiers 312, 324, and 336. As any desired amount of tilt compensation can be performed, up to an Nth amplifier portion (or stage) 330 (N being a positive integer) and Nth summer 331 can also be added.

Third amplifier portion 328 includes a third amplifier 336 and a third filter 338. Third amplifier 336 is on a fifth path 340 that also includes a fifth switch 342. Third filter 338 is on a sixth path 344 that also includes a sixth switch 346.

Nth amplifier portion 330 includes an Nth amplifier 348 and an Nth filter 350. Nth amplifier 348 is on an Nth-1 path 352 that also includes an Nth-1 switch 354. Nth filter 350 is on an Nth path 356 that also includes an Nth switch 358.

In one example, each additional amplifier portion 328 to 330 will operate as discussed above with respect to first and second portions 308 and 310.

As discussed above, a signal is detected. The detection can occur anywhere in system 200 in FIG. 2, for example either at input 302, output 304, or at another desired point in system 200. The detected signal is analyzed in order to determine what switching operation within amplifier system 300 is desired in order for a signal to be compensated for frequency tilt, such that at output 304 the signal exhibits desired characteristics.

A first detection scheme can perform a frequency scan of a signal to determine a power signal profile every, e.g., about 100 MHz. Then, in this example, a determination is made as to what switches and filters are needed to produce a desired output signal through compensating for positive and/or negative frequency tilt for each period between 50 MHz and 1 GHz.

A second detection scheme can be to send a signal through system 300 during a "testing" operation. Switches are turned on and off to determine what output signal results. Then, the switches are subsequently controlled based on this initial testing period.

A third detection scheme can be to use two receivers (not shown), e.g., receivers can be coupled to paths 234 and 238. In one receiver, one frequency is transmitted. In the other receiver, a scan is made across various frequencies. From the power difference, a frequency spectrum profile is determined.

In another example, a fast ADC (not shown) can digitize a full spectrum and derive frequency profile and hence required compensation. In another example, frequency compensation can be applied to non-flat or flat spectrum. By estimating the power difference when frequency compensation is activated and not, a decision can be made if to assert the tilt. In another example, when more than one receiver is utilized, one receiver can be used as reference for a particular frequency and another receiver is used to scan different frequencies and extrapolate the frequency spectrum. It is to be appreciated these are exemplary, and not exhaustive, detection schemes that can be used in order to generate control signals to control the switches for desired frequency tilt compensation.

Figure 4:
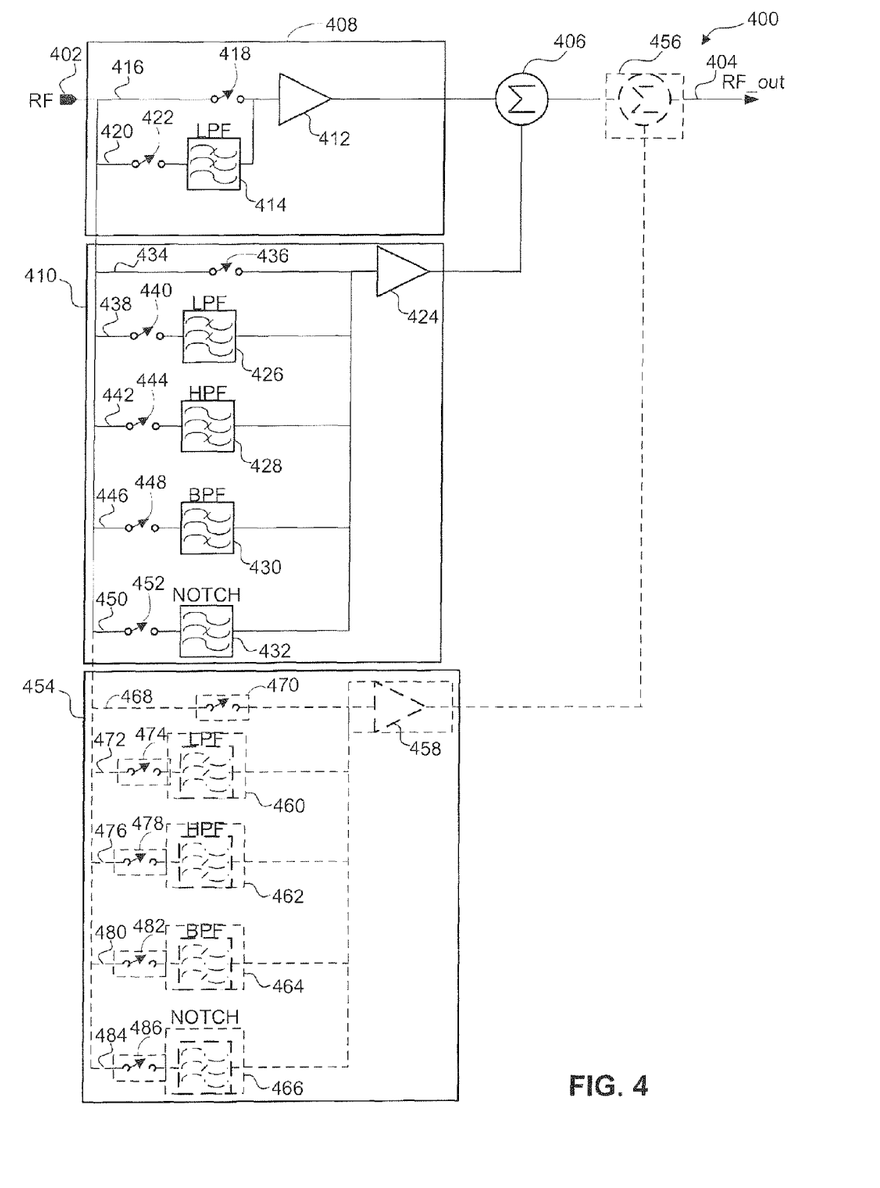

FIG. 4 shows an amplifier system 400, according to an embodiment of the present invention. For example, amplifier system 400 can be used to implement any of amplifiers 220, 222, and/or 224 in FIG. 2. Amplifier system 400 includes an input node 402, an output node 404, a summing device 406, a first amplifier portion 408 and a second amplifier portion 410. Although amplifier system 400 is similar to amplifier system 300, a main difference is that second amplifier portion can include up to four of the same or different combinations of filter types to perform various filtering and tilt compensation schemes, as would be understood by a skilled artisan upon reading this disclosure. For example, high pass filters, low pass filters, notch filters, or band pass filters can be used in any combination in second amplifier portion, as discussed in more detail below. This can be used, for example, when a signal fluctuates within a certain time period (see FIG. 5) between positive tilt, negative tilt, and no tilt in order to properly compensate the fluctuating frequency tilt of the signal. In comparison, a signal being processing by system 300 in FIG. 3 may have a continuous slope of either positive or negative frequency tilt.

First amplifier portion 408 includes a first amplifier 412 and a first filter 414. First amplifier 412 is on a first path 416 that also includes a first switch 418. First filter 414 is on a second path 420 that also includes a second switch 422.

Second amplifier portion 410 includes a second amplifier 424 and second through fifth filters 426, 428, 430, and 432. Second amplifier 424 is on a third path 434 that also includes a third switch 436. Second filter 426 is on a fourth path 438 that also includes a fourth switch 440. Third filter 428 is on a fifth path 442 that also includes a fifth switch 444. Fourth filter 430 is on a sixth path 446 that also includes a sixth switch 448. Fifth filter 432 is on a seventh path 450 that also includes a seventh switch 452.

In one example, first filter 414 is a low pass filter and second through fifth filters 426, 428, 430, and 432 are each one of a low pass filter, a high pass filter, a band pass filter and/or a notch filter. For example, as shown in FIG. 4, filter 426 is a low pass filter, filter 428 is a high pass filter, filter 430 is a band pass filter, and filter 432 is a notch filter. This arrangement can be used to ensure any frequency tilt, or fluctuating tilt, at any frequency of a signal, whether being a positive or negative tilt, can be accurately compensated through a programmed switching scheme.

For example, similar to as discussed with reference to FIG. 3, if no compensation tilt is needed, all switches can be opened. If 3 dB of positive compensation tilt is needed, switch 444 can be closed. If 3 dB of negative compensation tilt is needed, switch 422 can be closed. If 6 dB of negative compensation tilt is needed, switches 422 and 440 can be closed.

It is to be appreciated that many other switching schemes, too exhaustive to describe herein for brevity, can also be employed to allow for any desired tilt compensation to generate a signal at output 404 as desired.

It is to be appreciated that, as discussed above, if additional discrete compensation tilts are desired, additional amplifier portions or stages and additional corresponding summing devices can be used. For example, an Nth amplifier portion 454 and Nth summing device 456 is also shown in FIG. 4.

Nth amplifier portion 454 includes an Nth amplifier 458 and Nth-3 to Nth filters 460, 462, 464, and 466. Nth amplifier 458 is on an Nth-4 path 468 that also includes an Nth-4 switch 470. Nth-3 filter 460 is on an Nth-3 path 472 that also includes a Nth-3 switch 474. Nth-2 filter 462 is on an Nth-2 path 476 that also includes an Nth-2 switch 478. Nth-1 filter 464 is on an Nth-1 path 480 that also includes an Nth-1 switch 482. Nth filter 466 is on an Nth path 484 that also includes an Nth switch 486.

It is too be appreciated that within system 300 and 400, many additional or alternative filtering arrangements can be used. Many variations in numbers of stages can be used. For example, any number of HPF can be used. HPF frequencies for each filter can be the same or different to create different negative tilt equalizations. LPF frequencies for each filter can be the same or different to create different positive tilt equalizations. Any number of LPFs can be used. A HPF and LPF can be combined to create qualizations not monotonic. A HPF and LPF order can change to allow different profiles. Amplifiers can be driven by a bandpass filter to compensate for notches in the frequency response. Amplifiers can be driven by a notch filter and be subtracted at the output to amplify a weak signal in presence of strong unwanted signals instead of summed as shown in the embodiments above.

FIG. 5 shows a signal 500 having varying frequency tilts across a frequency spectrum. As shown, during different portions of a time period the frequency tilt can be positive, negative, or neutral.

CONCLUSION

It is to be appreciated that the Detailed Description section, and not the Abstract section, is intended to be used to interpret the claims. The Abstract section may set forth one or more, but not all, exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A system comprising:
   a summing device coupled to an output node;
   a first amplifier portion coupled between an input node and the summing device, the first amplifier portion including,
      a first amplifier coupled between the input node and the summing device on a first path,
      a first filter coupled between the input node and the first amplifier on a second path, the second path being in parallel to the first path,
      a first switch coupled between the input node and the first amplifier along the first path, and
      a second switch coupled between the input node and the first filter along the second path.

2. The system of claim 1, further comprising:
   a second amplifier portion coupled between the input node and the summing device, the second amplifier portion including,
      a second amplifier coupled between the input node and the summing device on a third path,
      a second filter coupled between the input node and the second amplifier on a fourth path, the fourth path being in parallel to the third path,
      a third switch coupled between the input node and the second amplifier along the third path, and
      a fourth switch coupled between the input node and the second filter along the fourth path.

3. The system according to claim 2, wherein the first and second filters are high pass filters.

4. The system according to claim 2, wherein the first and second filters are low pass filters.

5. The system of claim 2, further comprising:
   one or more additional amplifier portions coupled between the input node and the summing device.

6. The system of claim 2, wherein the first, second, third, and fourth switches are configured to be controlled to allow for discrete frequency compensation tilts of a signal between the input and the output.

7. The system of claim 6, wherein the frequency compensation tilt comprises positive frequency compensation tilt.

8. The system of claim 6, wherein the frequency compensation tilt comprises negative frequency compensation tilt.

9. The system of claim 6, wherein the frequency compensation tilt comprises substantially zero frequency tilt.

10. The system of claim 2, wherein the second amplifier portion further comprises:
    a fifth filter coupled between the input node and the second amplifier on a fifth path, the fifth path being in parallel to the third and fourth paths;
    a fifth switch coupled between the input node and the fifth amplifier along the fifth path;
    a sixth filter coupled between the input node and the second amplifier on a sixth path, the sixth path being in parallel to the third, fourth, and fifth paths;
    a sixth switch coupled between the input node and the sixth amplifier along the sixth path;
    a seventh filter coupled between the input node and the second amplifier on a seventh path, the seventh path being in parallel to the third, fourth, fifth, and sixth paths; and
    a seventh switch coupled between the input node and the seventh amplifier along the seventh path.

* * * * *